United States Patent
Paronyan et al.

(10) Patent No.: US 10,724,136 B2
(45) Date of Patent: Jul. 28, 2020

(54) CONDUCTING HIGH TRANSPARENCY THIN FILMS BASED ON SINGLE-WALLED CARBON NANOTUBES

(71) Applicant: HONDA MOTOR CO., LTD., Minato-ku, Tokyo (JP)

(72) Inventors: Tereza Paronyan, Raymond, OH (US); Avetik Harutyunyan, Raymond, OH (US); Gugang Chen, Raymond, OH (US); Elena Mora Pigos, Lewis Center, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 442 days.

(21) Appl. No.: 15/002,354

(22) Filed: Jan. 20, 2016

(65) Prior Publication Data
US 2017/0204515 A1    Jul. 20, 2017

(51) Int. Cl.
*B32B 9/00*    (2006.01)
*C23C 16/26*    (2006.01)
*C23C 16/46*    (2006.01)
*C01B 32/00*    (2017.01)
*B82Y 30/00*    (2011.01)

(52) U.S. Cl.
CPC .............. *C23C 16/26* (2013.01); *C01B 32/00* (2017.08); *C23C 16/46* (2013.01); *B82Y 30/00* (2013.01); *Y10T 428/30* (2015.01)

(58) Field of Classification Search
CPC ................... B82Y 30/00; Y10T 428/30; C01B 30/022–0293; Y10S 977/742
USPC ............... 428/408; 252/501, 500; 427/429.1; 977/742; 423/447.1, 448
See application file for complete search history.

(56) References Cited

U.S. PATENT DOCUMENTS

| | | | |
|---|---|---|---|
| 6,706,402 B2 | 3/2004 | Rueckes et al. | |
| 7,250,148 B2 | 7/2007 | Yang et al. | |
| 2003/0122111 A1* | 7/2003 | Glatkowski | B82Y 10/00 252/500 |
| 2003/0180461 A1* | 9/2003 | Hwang | B82Y 30/00 427/249.1 |
| 2005/0214197 A1* | 9/2005 | Gu | B01J 23/24 423/447.3 |
| 2008/0014346 A1 | 1/2008 | Zheng et al. | |
| 2009/0191352 A1 | 7/2009 | DuFaux et al. | |
| 2010/0064973 A1 | 3/2010 | Jiang et al. | |
| 2010/0147365 A1* | 6/2010 | DeSimone | B82Y 10/00 136/255 |
| 2010/0158788 A1 | 6/2010 | Kim et al. | |
| 2010/0192851 A1 | 8/2010 | Shah et al. | |

(Continued)

FOREIGN PATENT DOCUMENTS

JP    2006-239618 A    9/2006

OTHER PUBLICATIONS

H. Zhang, D. Wei, Yunqi Liu, Bin Wu, L., Huang, H. Xi, J. Chen, G. Yu, H. Kajiura, and Y. Li, "A New "Bones/Muscles" Strategy for Preparing Highly Conducting Single-Walled Carbon-Nanotube Films with Ultrahigh Transparency," Small, vol. 5, Issue 21, p. 2392 (2009), 5 pages.

*Primary Examiner* — Daniel H Miller
(74) *Attorney, Agent, or Firm* — Arent Fox LLP

(57) ABSTRACT

Methods of making a single-walled carbon nanotube thin film, and the thin film which can be located on a substrate, and can have a resistance of less than 7500 ohm/square, and a transparency to 550 nm light of greater than 85%.

15 Claims, 2 Drawing Sheets

(56) References Cited

U.S. PATENT DOCUMENTS

2010/0197481 A1    8/2010   Brey et al.
2010/0209696 A1    8/2010   Seals et al.
2010/0221424 A1    9/2010   Malecki et al.
2012/0280213 A1*   11/2012   Gau .................... H01L 51/0048
                                                                     257/29

* cited by examiner

CONDUCTING HIGH TRANSPARENCY THIN FILMS BASED ON SINGLE-WALLED CARBON NANOTUBES

BACKGROUND

Field of the Invention

The present teachings relate to the preparation of conductive high transparency thin films of single-walled carbon nanotubes ("SWNT") via a direct synthesis method that produces the desired thin film without subsequent purification, having sheet resistance down to 4623 ohm/square, preferably down to 4500 ohm/square, and transparency of 550 nm light of up to 97%.

Discussion of the Related Art

Flexible, transparent electrodes are utilized in video displays, optical devices, sensors, solar cells, and numerous other electronic devices. These electrodes can be made from transparent conductive thin films composed of various inorganic or metallic materials which in some cases can be brittle, expensive and in limited supply. There is a need for more readily available and physically stable transparent conductive thin films.

Described herein are preparative methods for making thin films composed of SWNTs supported on quartz substrates and exhibiting sheet resistance down to 4623 ohm/square, preferably down to 4500 ohm/square, and transparency of at least 85% at 550 nm.

SUMMARY OF THE PRESENT DISCLOSURE

The present teachings are directed to a method of directly preparing thin films of carbon nanotubes by providing a substrate having a top surface and a vertical axis therethrough. The substrate is then treated by first contacting it with an acetone solution and applying ultrasonic energy, and second contacting it with an isopropanol solution and applying ultrasonic energy, followed by drying the substrate by flowing an inert gas over it. A carbon nanotube producing catalyst-containing solution is applied to the top surface of the substrate, and the substrate is spun about its vertical axis, and reapplying catalyst-containing solution until a sufficient amount of carbon nanotube producing catalyst-containing solution is deposited on the top surface, and the substrate is then quickly washed in a non-polar solvent. The substrate is positioned in a chemical vapor deposition ("CVD") apparatus, heated to a temperature sufficient to produce carbon nanotubes, and contacted a carbon-containing gas with the heated substrate to produce a thin film of carbon nanotubes on the top surface.

The present teachings also include a method of directly preparing thin films of carbon nanotubes by providing a substrate having top and bottom surfaces, and treating the substrate by first contacting it with an acetone solution and applying ultrasonic energy, and second contacting it with an isopropanol solution and applying ultrasonic energy. The substrate is then dried by flowing an inert gas or air over it. The substrate is next immersed into a carbon nanotube producing catalyst-containing solution, washed in a non-polar solvent, and then positioned in a CVD apparatus. The substrate is heated to a temperature sufficient to produce carbon nanotubes, and contacted with a carbon-containing gas to produce a thin film of carbon nanotubes on both top and bottom surfaces.

The present disclosure also teaches a thin film comprising a thin film of single wall carbon nanotubes located on a substrate, wherein the thin film of carbon nanotubes has a resistance of less than 7500 ohm/square, and the thin film of carbon nanotubes and the substrate have a transparency to 550 nm light of greater than 85%. The presently disclosed thin films have the above characteristics without having to undergo any post-synthesis treatments like doping, purification or heat treatments to remove materials or correct structural defects to obtain these levels of resistance and transparency.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention. In the drawings.

DETAILED DESCRIPTION

Figure 1A:
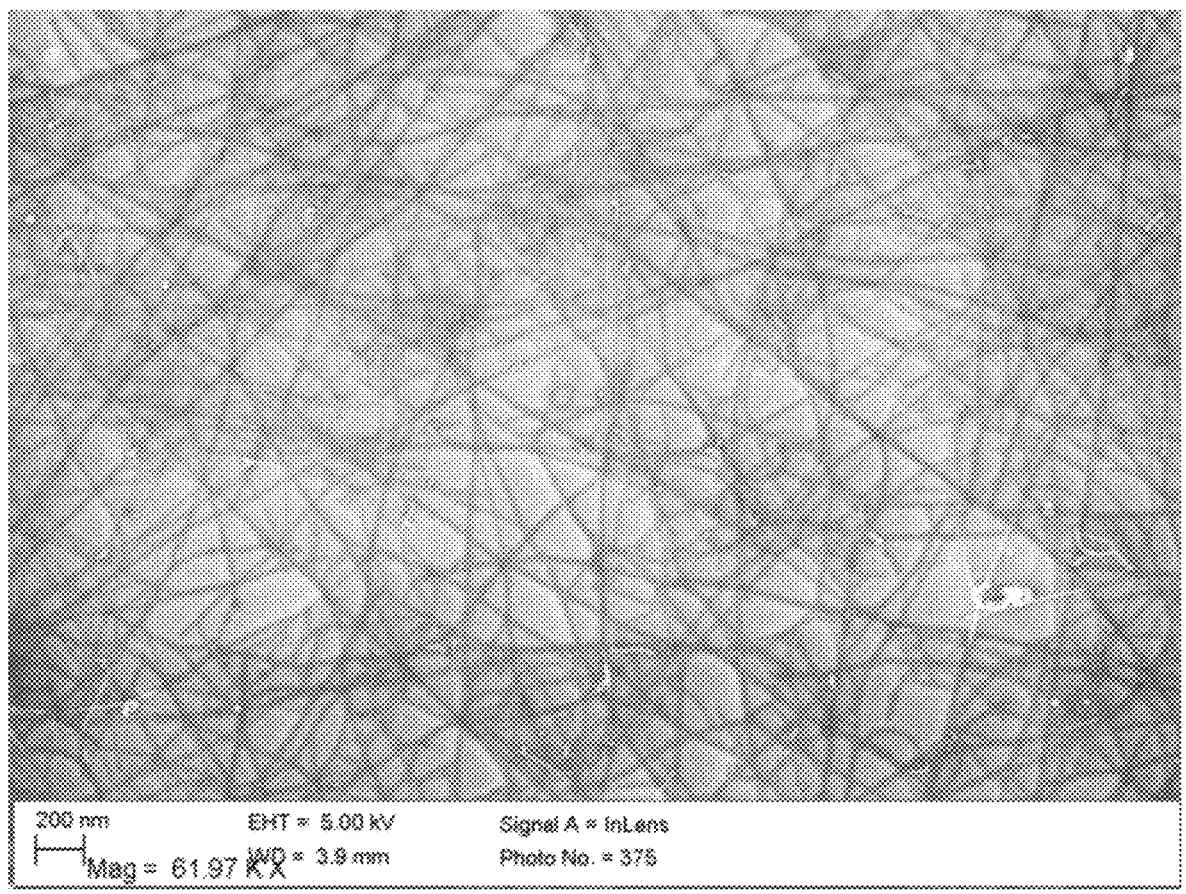
FIG. 1A is a scanning electron microscopy image.

The present teachings are directed to a method of directly preparing thin films of carbon nanotubes by providing a substrate having a top surface and a vertical axis therethrough. The substrate is then contacted with an acetone solution, followed by application of applying ultrasonic energy; next the substrate is contacted with an isopropanol solution followed by a second application of ultrasonic energy. The substrate is then dried by flowing an inert gas over it. A carbon nanotube producing catalyst-containing solution is applied to the top surface of the substrate, and the substrate is spun about its vertical axis. The catalyst-containing solution can be reapplied until a sufficient amount of carbon nanotube producing catalyst-containing solution is deposited on the top surface, and the substrate is then quickly washed in a non-polar solvent. The substrate is then positioned in a CVD apparatus, or other appropriate carbon nanotube growing environment, heated to a temperature sufficient to produce carbon nanotubes, and contacted a carbon-containing gas with the heated substrate to produce a thin film of carbon nanotubes on the top surface.

The present method can utilize a substrate composed of quartz, or any suitable substrate material that is highly transparent to light, and able to withstand the temperature exposure of the CVD synthesis procedure of up to 900° C.

The carbon nanotube producing catalyst-containing solution used in this method can be a carbon nanotube producing catalyst metal dissolved in an isopropanol solution. The carbon nanotube producing catalyst metal can include at least one metal selected from the group consisting of iron, cobalt, nickel, molybdenum, ruthenium, rhodium, palladium, silver and platinum. In some preferred cases of the present method, the catalyst metal can be iron, and more specifically, iron nitrate.

Application of the carbon nanotube producing catalyst-containing solution to the top surface of the substrate can be accomplished by adding the solution in small amounts in order to keep the surface wet during the spinning process. Any excess solution will be spun off the substrate.

For the washing step, the non-polar solvent can be hexane, and in most cases, this washing step can be a quick exposure of the substrate to the washing solution, for instance, less than ten seconds exposure.

In various embodiments of the present method, the carbon-containing gas contains at least one member selected from the group consisting of methane, ethane, acetylene, and propane. The carbon nanotubes produced by the present process are comprised of a majority of metallic carbon nanotubes.

The resulting thin film of carbon nanotubes can have resistance of less than 7500 ohm/square, and in some instances can be less than 5000 ohm/square.

The thin film of carbon nanotubes and the substrate can have a combined transparency to 550 nm light of greater than 85%, in some instances, the transparency can be greater than 90%, and in other instances, the transparency can be greater than 95%.

A "direct" preparation of a thin film of SWNTs as described in the present application refers to a thin film of single-walled CNTs which can be grown directly on a suitable substrate without subsequent physical or chemical treatment. Thus, the presently disclosed properties of resistance and transparency are observed after synthesis and without having to undergo any post-synthesis treatments, such as, doping, purification or heat treatments, as reported by others. These post-synthesis treatments are understood to either remove impurities or correct structural defects to obtain these levels of resistance and transparency.

Another method taught by the present disclosure is to directly prepare thin films of carbon nanotubes by providing a substrate having top and bottom surfaces, and treating the substrate by first contacting it with an acetone solution and applying ultrasonic energy, and second contacting it with an isopropanol solution and applying ultrasonic energy. The substrate is then dried by flowing an inert gas or air over it. The substrate is next immersed into a carbon nanotube producing catalyst-containing solution, washed in a non-polar solvent, and then positioned in a CVD apparatus, or other appropriate carbon nanotube growth environment. The substrate is heated to a temperature sufficient to produce carbon nanotubes, and contacted with a carbon-containing gas to produce a thin film of carbon nanotubes on both top and bottom surfaces.

Carbon nanotube thin films grown according to method described here dramatically reduce the sheet resistance of the film down to about 110 ohm/sq upon immersing in solvent (e.g., ethanol).

In some embodiments of the present method, the substrate comprises quartz.

A suitable carbon nanotube producing catalyst-containing solution can be a carbon nanotube producing catalyst metal in isopropanol, and suitable carbon nanotube producing catalyst metals include at least one metal selected from the group consisting of iron, cobalt, nickel, molybdenum, ruthenium, rhodium, palladium, silver and platinum.

The carbon nanotubes produced by this present method can be composed of a majority of metallic carbon nanotubes. The carbon-containing gas can be at least one member selected from the group consisting of methane, ethane and propane.

The carbon nanotubes produced by this present method can form a thin film of carbon nanotubes having a resistance of less than 7500 ohm/square, in some instances, the resistance of the thin film is less than 5000 ohm/square.

The present method can also be utilized to produce a thin film of carbon nanotubes which, on top of a suitable substrate, can have a transparency to 550 nm light of greater than 85%, in some cases, the transparency can be greater than 90%, and in some other cases, the transparency can be greater than 95%.

Also provided by the present teachings is a thin film made of single wall carbon nanotubes located on a substrate. The thin film of carbon nanotubes can have a resistance of less than 7500 ohm/square, and the thin film of carbon nanotubes and the substrate can have a transparency to 550 nm light of greater than 85%.

In some embodiments of the present teachings, the substrate comprises a quartz substrate, or any suitable substrate material that is highly transparent to light, and able to withstand the temperature exposure of a nanotube production environment, such as a CVD synthesis procedure, of up to 900° C. In some cases, the transparency of the supported thin film, that is, the thin film and the substrate together can be greater than 90%, and in some cases, the transparency can be greater than 95%. As set forth in Table 1, the present disclosure includes examples with transparencies exceeding 98% in some instances.

The presently disclosed thin films of SWNTs can have very low electrical resistances, such as resistance less than 5000 ohm/square. For the thin films of the present disclosure, the resistance is dependent on the quality of the SWNTs present in the thin film. The quality of the SWNTs is measured here as the ratio between the G and D bands of the Raman spectra. The D band is generally assigned to disordered or defective graphitic structures, and occurs typically between about 1325 and 1375 $cm^{-1}$, and can be centered at about 1350 $cm^{-1}$. The G band is assigned to the graphite structure of an ordered nanotube structure and is centered at about 1590 $cm^{-1}$, and can typically occur between about 1565 to about 1615 $cm^{-1}$.

The single wall carbon nanotubes produced by the presently disclosed method and making up the thin film can have a ratio between the G and D bands of the Raman spectrum of at least 8, in some cases the ratio can be greater than 10, and in some instances, SWNTs with a G/D ratio of greater than 12 have been produced.

The sheet resistance of the SWNT containing thin film can be measured by a four point probe equipment in either a linear or square array configuration. The probe array with needle spacing of usually 1 mm is placed around the center of the sample, where a correction factor is used in the case of small samples or probing close to the edge of a large sample.

All publications, articles, papers, patents, patent publications, and other references cited herein are hereby incorporated by reference herein in their entireties for all purposes.

Although the foregoing description is directed to the preferred embodiments of the present teachings, it is noted that other variations and modifications will be apparent to those skilled in the art, and which may be made without departing from the spirit or scope of the present teachings.

EXPERIMENTAL

A solution of Fe(III) nitrate in isopropanol can be used as a catalyst precursor. The concentration of the solution can range from 0.04 to 1.0 mg/mL. The solution can be deposited onto the surface of a suitable substrate, like quartz.

A suitable substrate will be highly transparent in the 550 nm region, and will also be able to withstand the temperature range (likely from 600° C. to 900° C.) required for the CVD method of growing SWNTs.

Deposition of the catalyst can occur by dipping the substrate in the catalyst-containing solution for 15 minutes, followed by rinsing for 8 seconds in hexane; or by allowing the catalyst solution to dry on the substrate for 15 minutes then rinsing in hexane for 8 seconds.

For some important embodiments of the present methods, the catalyst can be supported on a support powder (for example, high surface area alumina), then dispersed in a solution, and finally the supported catalyst-containing solution can be dispersed onto the substrate surface.

The catalyst particles (supported and non-supported) can be reduced in a He/H$_2$ or (Ar/H$_2$) atmosphere at 500° C. for 10 minutes. The temperature is then ramped up to desired growth temperature, ranging in most instances, from 800° C. to 900° C. Methane gas can replace the reducing gas, and can be added for varying amounts of time, for example from 10 to 45 minutes. The methane gas is stopped, and the reactor is cooled down under either He or Ar gas.

This process results in a thin film of SWNT (mostly metallic) on the substrate. The thin film has the desired properties of high transparency and conductivity.

As used herein, highly conductive refers to sheet resistance of less than 7500 ohms per square; highly transparent refers to light transmission of greater than 85%, preferably greater than 90%, and most preferably greater than 95% of light at 550 nm. Directly produced means the thin film nanotube sheet is grown directly on a suitable substrate without subsequent physical or chemical treatment.

The sheet resistance is measured by a four point probe equipment in either a linear or square array configuration. The probe array with needle spacing of usually 1 mm is placed around the center of the sample, where a correction factor is used in the case of small samples or probing close to the edge of a large sample. The transmittance is measured at 550 nm. Scanning electron microscopy images were obtained on a Zeiss UltraPlus SEM.

Table 1 presents the data from five different synthetic routes utilizing 0.04 mg Fe(NO$_3$)$_3$ anhydrate/mL isopropanol spun coated onto a quartz substrate. The coated substrate was then reduced for 10 minutes at 500° C. under 20% H$_2$ in He, and exposed to methane gas at each of the five listed temperatures (820, 830, 840, 850, and 860 C) for 45 minutes. The resulting thin films on quartz substrates were then measured for G/D area ratio by Raman spectroscopy, sheet resistance, and transparency at 550 nm.

TABLE 1

SWNT Synthesis Temperature Effect

| Table 1 - SWNT Synthesis Temperature Effect T (° C.) | Ratio (G/D) | Sheet Resistance (Ω/sq) | T (%) |
|---|---|---|---|
| 860 | 1.65 | 95,633.64 | 96.96 |
|  | 0.57 | 96,086.88 | 95.79 |
| 850 | 8.54 | 12,056.18 | 98.74 |
|  | 11.18 | 14,549.00 | 98.67 |
| 840 | 8.70 | 7,478.46 | 97.21 |
|  | 8.86 | 13,053.31 | 97.83 |
| 830 | 11.04 | 4,623.05 | 96.90 |
|  | 11.08 | 5,892.12 | 98.58 |
| 820 | 9.48 | 66,173.04 | 99.52 |

Tables 2 and 3 present the experimental results for the same catalysts and reduction conditions as Table 1 but with varied synthesis times and temperatures. The results of Table 2 are for Fe coated substrate exposed to methane for 15, 45, and 90 minutes at 850° C., while Table 3 presents results for SWNT synthesis for 45 and 90 minutes at 830° C.

TABLE 2

SWNT Synthesis Time

| Time | Ratio (G/D) | Sheet Resistance (Ω/sq) | T (%) |
|---|---|---|---|
| 15 | 3.10 | 126,540.08 | 99.69 |
|  | 6.53 | 85,662.36 | 99.58 |

TABLE 2-continued

SWNT Synthesis Time

| Time | Ratio (G/D) | Sheet Resistance (Ω/sq) | T (%) |
|---|---|---|---|
| 45 | 8.54 | 12,056.18 | 98.74 |
|  | 11.18 | 14,549.00 | 98.67 |
| 90 | 9.40 | 13,869.14 | 98.36 |
|  | 5.81 | 28,780.74 | 98.78 |

TABLE 3

SWNT Synthesis Time

| Time | Ratio (G/D) | Sheet Resistance (Ω/sq) | T (%) |
|---|---|---|---|
| 45 | 11.04 | 4,623.05 | 96.90 |
|  | 11.08 | 5,892.12 | 98.58 |
| 90 | 8.39 | 7,161.19 | 98.81 |
|  | 7.27 | 6,028.09 | 98.72 |

Table 4 utilizes the same catalyst but varies the duration of the reduction treatment in 20% H$_2$ in He from 10 to 30 to 60 minutes, and then undergoes SWNT synthesis with methane gas being added for 45 minutes at 830° C.

TABLE 4

Effect of Reduction Time

| Reduction time @500 C. | Metallic SWNT (%) | Ratio (G/D) | Sheet Resistance (Ω/sq) | T (%) |
|---|---|---|---|---|
| 10 | 68.95 | 11.04 | 4,623.05 | 96.90 |
|  | 76.91 | 11.08 | 5,892.12 | 98.58 |
| 30 | 34.71 | 6.55 | 6,662.63 | 97.55 |
|  | 29.86 | 9.25 | 13,143.96 | 98.20 |
| 60 | 28.04 | 7.79 | 7,705.08 | 97.16 |
|  | 29.86 | 7.78 | 4,804.34 | 96.45 |

Table 5 presents the results from use of two different concentrations of H$_2$ in the He carrier gas during the catalyst reduction step. The Fe catalysts were reduced in either 20 or 40% H$_2$ in He for 10 minutes at 500° C., followed by 45 minutes of exposure to methane at 830° C.

TABLE 5

Effect of Reduction Time

| % H2 in He | Metallic SWNT (%) | Ratio (G/D) | Sheet Resistance (Ω/sq) | T (%) |
|---|---|---|---|---|
| 20 | 68.95 | 11.04 | 4,623.05 | 96.90 |
|  | 76.91 | 11.08 | 5,892.12 | 98.58 |
| 40 | 52.58 | 6.03 | 11,331.00 | 96.67 |
|  | 38.17 | 5.31 | 6,164.06 | 95.92 |
|  | 37.74 | 7.55 | 8,928.83 | 97.91 |
|  | 42.82 | 5.06 | 6,390.68 | 95.57 |
|  | 42.45 | 5.34 | 6,345.36 | 93.82 |

Example 1

A solution of Fe(III) nitrate in isopropanol was prepared as a catalyst precursor solution. The concentration of the solution was 0.04 mg/mL Fe.

The iron nitrate solution was deposited onto the surface of a quartz substrate. The substrate was dipped in the solution for 15 minutes, followed by rinsing for 8 seconds in hexane.

The catalyst particles on the substrate were then reduced in a He/$H_2$ atmosphere at 500° C. for 10 minutes, the temperature was then ramped up to growth temperature, 850° C. Methane gas was added for 45 minutes. The methane gas was stopped, and the reactor cooled down under He gas.

This process resulted in a thin film of mostly metallic SWNT on the quartz substrate. The thin film had light transmission of 98.74% of light at 550 nm, and a sheet resistance of 12.06 Kohms per square.

Example 2

A solution of Fe(III) nitrate in isopropanol was prepared as a catalyst precursor solution. The concentration of the solution was 0.04 mg Fe nitrate nonahydrate/mL isopropanol.

The iron nitrate solution was deposited dropwise onto the surface of a quartz substrate. The substrate was allowed to dry for 15 minutes then rinsed in hexane for 8 seconds.

The catalyst particles on the substrate are placed in a CVD reactor, then reduced in a He/$H_2$ atmosphere at 500° C. for 30 minutes, the temperature was then ramped up to growth temperature, 830° C. Methane gas was added for 45 minutes. The methane gas was stopped, and the reactor cooled down under He gas.

This example process resulted in a thin film of 34.71% metallic SWNT on quartz substrate. The thin film had light transmission of 97.55% of light at 550 nm, and a sheet resistance of 6.66 K ohms per square.

Example 3

A solution of Fe(III) nitrate in isopropanol was prepared as a catalyst precursor solution. The concentration of the solution was 0.04 mg Fe nitrate nonahydrate/mL isopropanol.

A solution of Fe(III) nitrate in isopropanol spun coated at 200 rpm over a fifteen minute time period onto a quartz substrate which had been prepared by two 15 minute sonication treatments in first acetone, and then isopropanol, followed by drying under a flow of nitrogen gas. The iron nitrate solution was added approximately every five minutes in order to keep the surface of the substrate wetted.

The substrate was then is allowed to dry for 15 minutes then rinsed in hexane for 8 seconds.

The substrate was then reduced in a 20% $H_2$ in He atmosphere at 500° C. for 10 minutes, the temperature was ramped up to growth temperature, 830° C. Methane gas was added for 45 minutes. The methane gas stopped, and the reactor was cooled down under He gas.

This example process resulted in a thin film of 68.95% metallic SWNT on quartz substrate. The thin film had light transmission of 96.90% of light at 550 nm, and a sheet resistance of 4.62 K ohms per square.

Figure 1B:
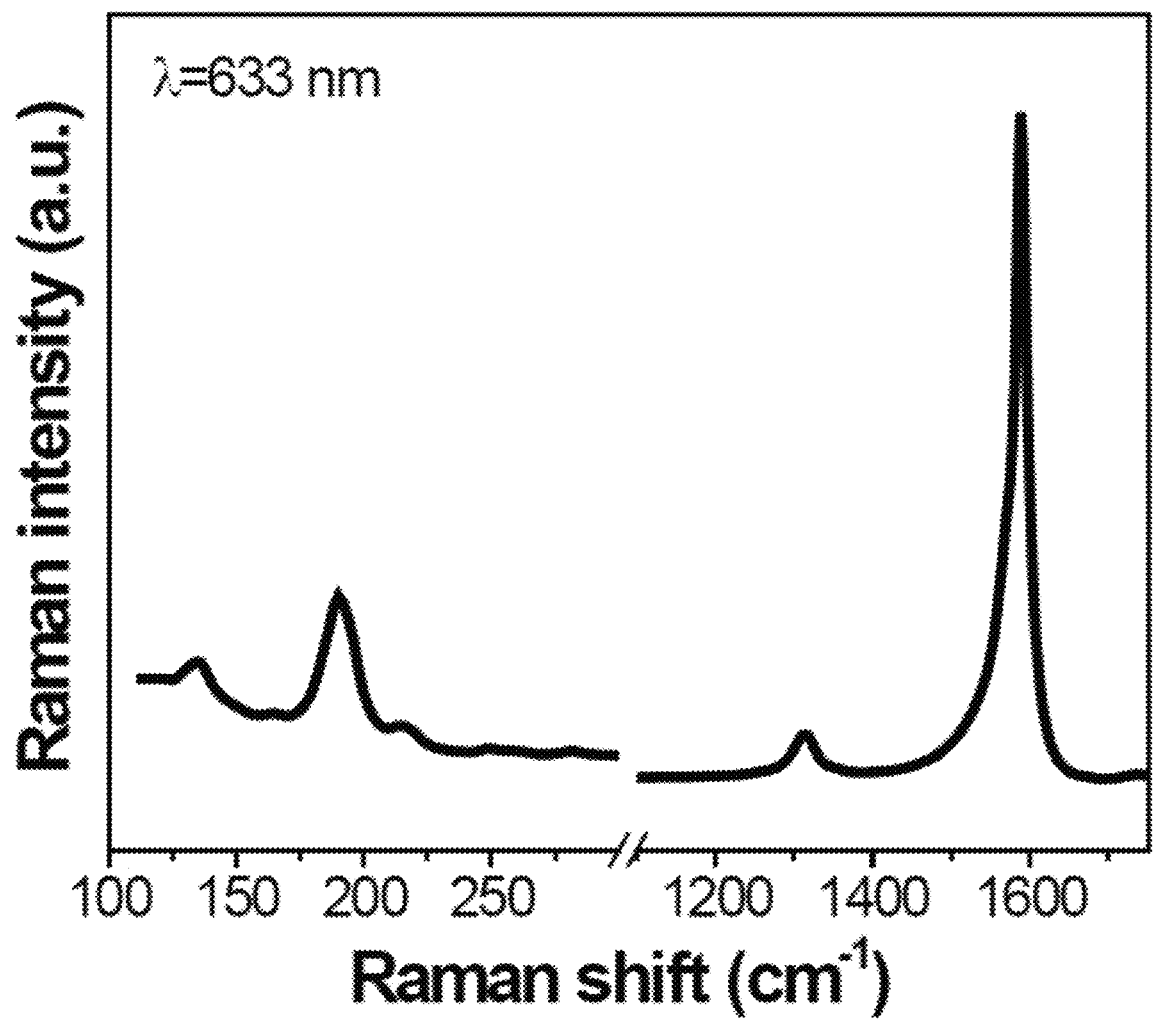
FIG. 1B is a Raman spectrum.

FIG. 1A is an scanning electron microscopy image of the resulting thin film and shows long nanotubes which is understood to lead to lower resistance. FIG. 1 B is a Raman spectrum at 633 nm wavelength, and shows a dominant G band at 1590 $cm^{-1}$, and a small D band at about 1350 $cm^{-1}$ which provides a G/D ratio of 11.04. The radial breathing mode is also observed at about 185 $cm^{-1}$.

The foregoing detailed description of the various embodiments of the present teachings has been provided for the purposes of illustration and description. It is not intended to be exhaustive or to limit the present teachings to the precise embodiments disclosed. Many modifications and variations will be apparent to practitioners skilled in this art. The embodiments were chosen and described in order to best explain the principles of the present teachings and their practical application, thereby enabling others skilled in the art to understand the present teachings for various embodiments and with various modifications as are suited to the particular use contemplated. It is intended that the scope of the present teachings be defined by the following claims and their equivalents.

What we claim is:

1. A method of directly preparing thin films of carbon nanotubes comprising:
   providing a substrate having a top surface and a vertical axis therethrough;
   contacting the substrate with an acetone solution and applying ultrasonic energy;
   contacting the substrate with an isopropanol solution and applying ultrasonic energy;
   flowing an inert gas over the substrate;
   applying a carbon nanotube producing catalyst-containing solution to the top surface of the substrate;
   spinning the substrate about its vertical axis, and reapplying catalyst-containing solution until a sufficient amount of carbon nanotube producing catalyst-containing solution is deposited on the top surface;
   washing the substrate in a non-polar solvent;
   positioning the substrate in a chemical vapor deposition apparatus;
   heating the substrate to a temperature of from 800° C. to 900° C. sufficient to produce carbon nanotubes, and
   contacting a carbon-containing gas with the heated substrate to produce a thin film of carbon nanotubes on the top surface.

2. The method according to claim 1, wherein the substrate comprises quartz.

3. The method according to claim 1, wherein the carbon nanotube producing catalyst comprises at least one metal selected from the group consisting of iron, cobalt, nickel, molybdenum, ruthenium, rhodium, palladium, silver and platinum.

4. The method according to claim 1, wherein the carbon nanotubes are comprised of a majority of metallic carbon nanotubes.

5. The method according to claim 1, wherein the carbon-containing gas contains at least one member selected from the group consisting of methane, ethane and propane.

6. The method according to claim 1, wherein the thin film of carbon nanotubes has a resistance of less than 7500 ohm/square.

7. The method according to claim 1, wherein the thin film of carbon nanotubes and the substrate have a transparency to 550 nm light of greater than 85%.

8. A method of directly preparing thin films of carbon nanotubes comprising:
   providing a substrate having top and bottom surfaces;
   contacting the substrate with an acetone solution and applying ultrasonic energy;
   contacting the substrate with an isopropanol solution and applying ultrasonic energy;
   flowing an inert gas over the substrate;
   immersing the substrate into a carbon nanotube producing catalyst-containing solution;
   washing the substrate in a non-polar solvent;

positioning the substrate in a chemical vapor deposition apparatus;

heating the substrate to a temperature of from 800° C. to 900° C. sufficient to produce carbon nanotubes, and contacting a carbon-containing gas with the heated substrate to produce a thin film of carbon nanotubes on both top and bottom surfaces.

9. The method according to claim 8, wherein the substrate comprises quartz.

10. The method according to claim 8, wherein the carbon nanotube producing catalyst comprises at least one metal selected from the group consisting of iron, cobalt, nickel, molybdenum, ruthenium, rhodium, palladium, silver and platinum.

11. The method according to claim 8, wherein the carbon nanotubes are comprised of a majority of metallic carbon nanotubes.

12. The method according to claim 8, wherein the carbon-containing gas contains at least one member selected from the group consisting of methane, ethane and propane.

13. The method according to claim 8, wherein the thin film of carbon nanotubes has a resistance of less than 7500 ohm/square.

14. The method according to claim 8, wherein the thin film of carbon nanotubes and the substrate have a transparency to 550 nm light of greater than 85%.

15. The method according to claim 1, wherein washing the substrate in the non-polar solvent comprises exposing the substrate to the non-polar solvent for less than ten seconds.

* * * * *